US008467194B2

(12) United States Patent
Sasaki et al.

(10) Patent No.: US 8,467,194 B2
(45) Date of Patent: Jun. 18, 2013

(54) AC ADAPTER

(75) Inventors: Dai Sasaki, Tokyo (JP); Taisuke Koga, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 199 days.

(21) Appl. No.: 13/027,634

(22) Filed: Feb. 15, 2011

(65) Prior Publication Data

US 2011/0199742 A1 Aug. 18, 2011

(30) Foreign Application Priority Data

Feb. 17, 2010 (JP) ................................ 2010-031903

(51) Int. Cl.
*H05K 1/11* (2006.01)
*H05K 1/14* (2006.01)

(52) U.S. Cl.
USPC ........................................................ 361/792

(58) Field of Classification Search
USPC .......................... 361/720, 721, 736, 748, 784
See application file for complete search history.

(56) References Cited

U.S. PATENT DOCUMENTS 5,717,556 A * 2/1998 Yanagida ...................... 361/803
5,742,484 A * 4/1998 Gillette et al. ................ 361/789
5,917,707 A * 6/1999 Khandros et al. ............. 361/776
6,031,730 A * 2/2000 Kroske ......................... 361/784
6,040,624 A * 3/2000 Chambers et al. ............ 257/692
6,118,081 A * 9/2000 Faragi et al. .................. 174/260
6,162,067 A * 12/2000 Haga ........................... 439/76.1
6,172,881 B1 * 1/2001 Hirai ............................ 361/816
6,201,689 B1 * 3/2001 Miyasyo .................. 361/679.54
6,531,662 B1 * 3/2003 Nakamura .................... 174/255
6,594,152 B2 * 7/2003 Dent ............................ 361/785
6,704,169 B2 * 3/2004 Nawa ......................... 360/261.3
6,797,891 B1 * 9/2004 Blair et al. .................... 174/268
6,929,515 B1 * 8/2005 Schneider et al. ............ 439/654
6,985,659 B2 * 1/2006 Torigoe et al. ................ 385/114
6,990,355 B2 * 1/2006 Ueyama et al. ............ 455/550.1
6,997,720 B2 * 2/2006 Perret et al. ..................... 439/67
7,286,370 B2 * 10/2007 Ooyabu ........................ 361/803
7,304,373 B2 * 12/2007 Taggart et al. ................ 257/686
7,388,756 B1 * 6/2008 Worl et al. .................... 361/760
7,479,345 B2 * 1/2009 Nakamura .................... 429/129
7,606,041 B2 * 10/2009 Park ............................. 361/749
7,618,283 B1 * 11/2009 Costello ........................ 439/511
2002/0034068 A1 * 3/2002 Weber et al. ................. 361/790
2005/0287842 A1 12/2005 Muramatsu
2008/0299834 A1 * 12/2008 Salomon et al. .............. 439/660

FOREIGN PATENT DOCUMENTS

JP 2006-012618 1/2006

* cited by examiner

*Primary Examiner* — Hoa C Nguyen
*Assistant Examiner* — Xanthia C Cunningham
(74) *Attorney, Agent, or Firm* — IPUSA, PLLC

(57) ABSTRACT

An AC adapter including an electronic device, a first circuit board on which the electronic device is mounted, a second circuit board separated from the first circuit board, a connector mounted on the second circuit board and electrically connected to the second circuit board, first and second metal wirings that electrically connect the first and the second circuit boards, and an insulation case installing the first circuit board, the electronic device, the second circuit board, and the connector therein and including a projecting part interposed between the first and second metal wirings.

7 Claims, 6 Drawing Sheets

AC ADAPTER

BACKGROUND OF THE INVENTION

1. Field of the Invention

The present invention generally relates to an AC adapter such as an AC adapter including a first circuit board on which an electronic device is mounted, a second circuit board electrically connected to the first circuit board, and a connector provided to the second circuit board and electrically connected to the second circuit board.

2. Description of the Related Art

As one example of an AC adapter for supplying electric power to an electronic device (e.g., portable electronic device), there is an AC adapter having a connector for connecting an AC cord. With this kind of AC adapter, the circuit board of the AC adapter or the electronic device mounted on the circuit board may be damaged by stress caused by repetitive inserting and pulling of the AC cord.

In order to prevent damage of the circuit board and the electronic device, an AC adapter of a related art example includes a circuit board that is divided into a first circuit board on which an electronic device is mounted and a second circuit board to which a connector is connected (see, for example, FIGS. 8 and 9).

FIG. 8 is a plan enlarged view of a connection part that connects first and second circuit boards of an AC adapter 200 according to a related art example. FIG. 9 is a schematic diagram of the configuration illustrated in FIG. 8 in a case where the configuration is viewed from letter J of FIG. 8. For the sake of convenience, an insulation case of the AC adapter 200 is omitted from FIGS. 8 and 9.

With reference to FIGS. 8 and 9, the AC adapter 200 includes a first circuit board 201, an electronic device 202, a second circuit board 204, a connector 205, wires 207, 208, and an insulation case (not illustrated).

The first circuit board 201 is a substrate having a greater area than that of the second circuit board 204. The first circuit board 201 includes a planar substrate body 211 and a wiring pattern 212 formed on a first surface 211A of the substrate body 211.

The electronic device 202 is mounted on the first surface 211A of the substrate body 211 and electrically connected to the wiring pattern 212. The electronic device may be, for example, a capacitor, a transformer, or a switching device.

The second circuit board 204 includes a planar substrate body 215 and wiring patterns 217, 218 formed on a first surface 215A of the substrate body 215.

The connector 205 is mounted on a second surface 215B of the substrate body 215. The connector 205 is electrically connected to the wiring patterns 217, 218. The connector 205 has a plug connection surface 205A provided on the side to which a plug (not illustrated) of an AC cord is connected. The plug (not illustrated) of the AC cord is repetitively inserted into and pulled out from the connector 205.

The wirings 207, 208 are formed of wires covered with an insulation material. Both ends of the wires of the wirings 207, 208 are exposed from the insulation material. A first end part of the wire of the wiring 207 penetrates through the first circuit board 201 and is electrically connected to the wiring pattern 212. Further, the other end part of the wire of the wiring 207 penetrates through the second circuit board 204 and is electrically connected to the wiring pattern 218.

A first end part of the wire of the wiring 208 penetrates through the first circuit board 201 and is electrically connected to the wiring pattern 212. Further, a second end part of the wire of the wiring 208 penetrates through the second circuit board 204 and is electrically connected to the wiring pattern 217.

The insulation case (not illustrated) is a case for installing the first circuit board 201, the electronic device 202, the second circuit board 202, the connector 205, and the wirings 207, 208 therein. The first circuit board 201, the electronic device 202, the second circuit board 202, the connector 205, and the wirings 207, 208 are stored in a state that the plug connection surface 205A of the connector 205 is exposed (see, for example, Japanese Laid-Open Patent Application No. 2006-12618).

With the AC adapter 200 according to the related art example, there is a problem that the cost of the AC adapter 200 increases because the first and second circuit boards 201, 204 are connected by using expensive wirings 207, 208 that have an insulation material covering the wires of the wirings 207, 208.

Further, in connecting the wirings 207, 208 to the first and second circuit boards 201, 204, a step of removing the insulating material at the first and second end parts of the wirings 207, 208 is required for enabling wires of the wirings 207, 208 become exposed at the first and second end parts of the wirings 207, 208.

SUMMARY OF THE INVENTION

The present invention may provide an AC adapter that substantially eliminates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an AC adapter particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides an AC adapter including: an electronic device; a first circuit board on which the electronic device is mounted; a second circuit board separated from the first circuit board; a connector mounted on the second circuit board and electrically connected to the second circuit board; first and second metal wirings that electrically connect the first and the second circuit boards; and an insulation case installing the first circuit board, the electronic device, the second circuit board, and the connector therein and including a projecting part interposed between the first and second metal wirings.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

[First Embodiment]

Figure 1:
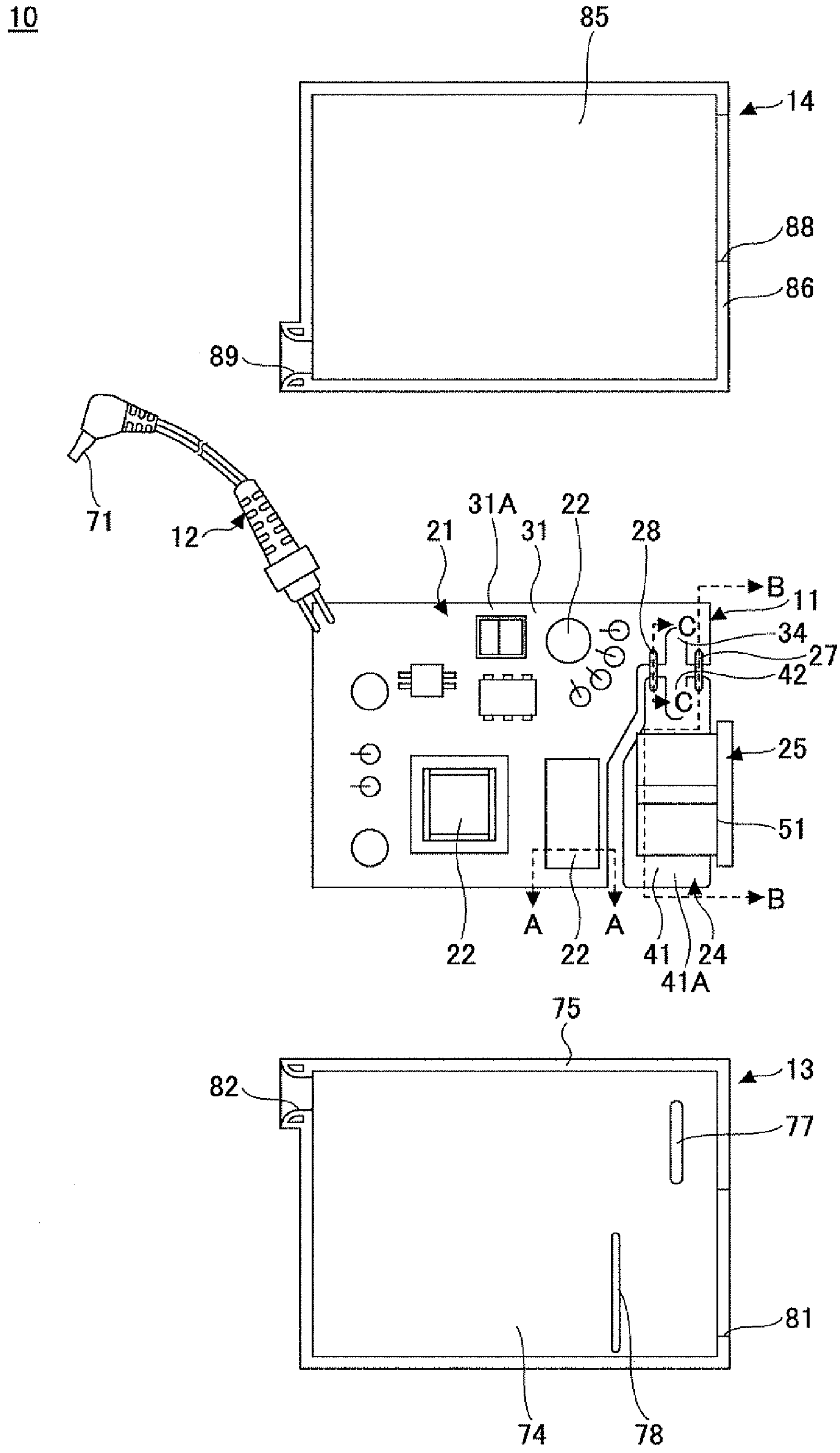
FIG. 1 is a plan exploded view of an AC adapter according to an embodiment of the present invention.

FIG. 1 is a plan exploded view of an AC adapter 10 according to an embodiment of the present invention.

The AC adapter 10 according to the embodiment illustrated in FIG. 1 includes an AC adapter body 11, a DC cord 12, a lower case 13, and an upper case 14. The lower case 13 and the upper case 14 form an insulation case.

The AC adapter body 11 includes a first circuit board 21, an electronic device(s) 22, a second circuit board 24, a connector 25, a first metal wiring (first electric connection member) 27, and a second metal wiring (second electric connector member) 28.

Figure 2:
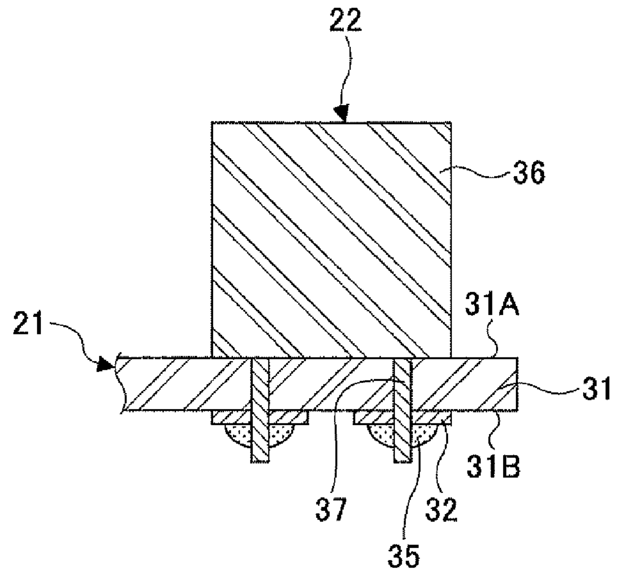
FIG. 2 is a cross-sectional view of the AC adapter of FIG. 1 taken along line A-A of FIG. 1.

FIG. 2 is a cross-sectional view taken along line A-A of FIG. 1. In FIG. 2, like components are denoted with like reference numerals as those of FIG. 1.

With reference to FIGS. 1 and 2, the first circuit board 21 is a substrate on which plural electronic devices 22 are mounted. The first circuit board 21 includes a substrate body 31 and wiring pattern (first wiring pattern) 32. The substrate body 31 includes a first substrate surface (device mounting surface) 31A, a second substrate surface 31B positioned on the side opposite of the first substrate surface 31A, and a notch part 34. The first substrate surface 31A is for mounting the electronic device 22 thereon. The second substrate surface 31B is for having the wiring pattern 32 formed thereon. The notch part 34 is for allowing a below-described first projecting part 77 of the lower case 13 to penetrate therethrough. For example, a resin substrate may be used as the substrate body 31.

The wiring pattern 32 is provided on the second substrate surface 31B of the substrate body 31. The wiring pattern 32 is a pattern for electrically connecting the electronic device 22 to the first and second metal wirings 27, 28.

The first circuit board 21 includes first and second through-holes 110, 120 penetrating through the substrate body 31 and the wiring pattern 32. The first through-hole 110 (see FIG. 4) is a hole formed in the substrate body 31 and the wiring pattern 32 into which the first metal wiring 27 is inserted. The second through-hole 120 (see FIG. 5) is a hole formed in the substrate body 31 and the wiring pattern 32 into which the second metal wiring 28 is inserted.

The electronic device 22 includes a device body 36 and pin connectors 37 integrally formed with the device body 36. The device body 36 is mounted on the first substrate surface 31A of the substrate body 31. The pin connectors 37 are electrically connected to the device body 36. The pin connectors 37 penetrate through the substrate body 31 and the wiring pattern 32. A portion of each pin connector 37 protrudes from the wiring pattern 32. The protruding portion of the pin connector 37 is fixed, to the wiring pattern 32 by solder 35. Thereby, the electronic device 22 is electrically connected to the wiring pattern 32. The electronic device 22 may be, for example, a capacitor, a transformer, or a switching device.

Figure 3:
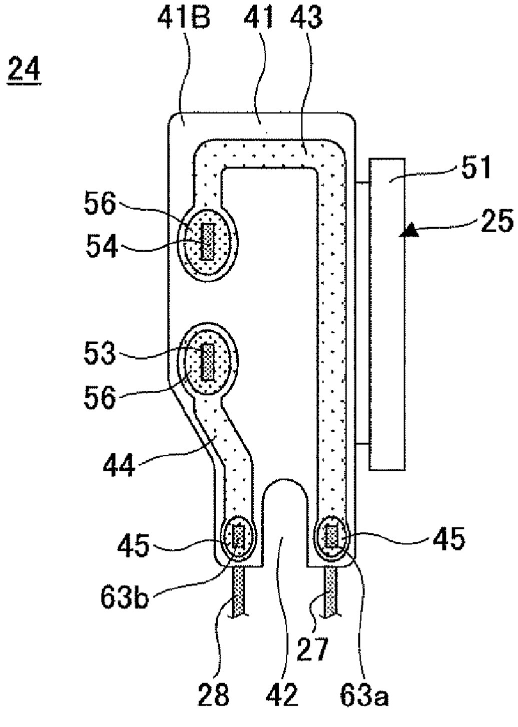
FIG. 3 is a plan view illustrating an inverted state of a second circuit board of FIG. 1.
Figure 4:
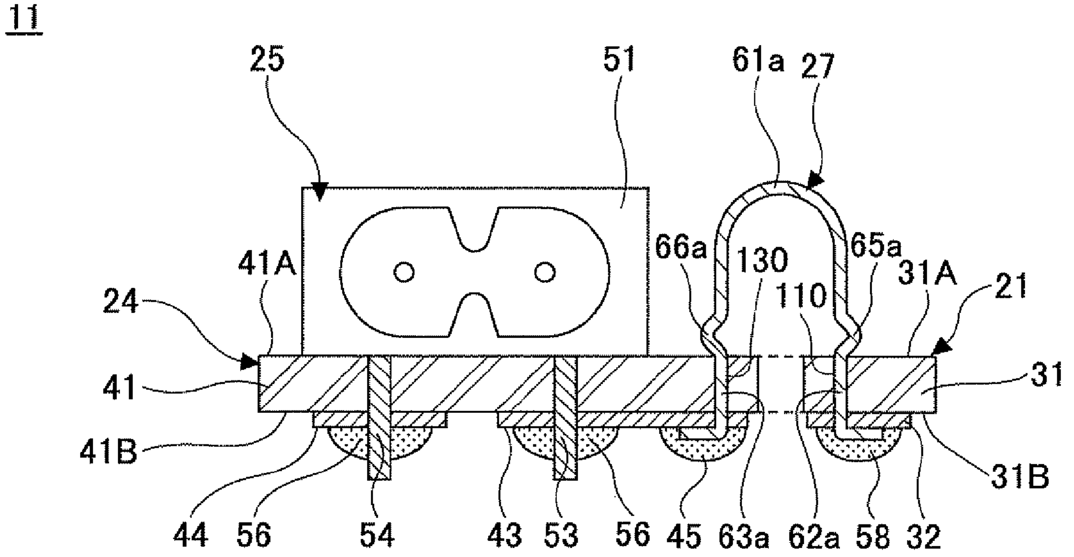
FIG. 4 is a cross-sectional view of the AC adapter body of FIG. 1 taken along line B-B of FIG. 1.

FIG. 3 is a plan view illustrating an inverted state of the second circuit board 24 of FIG. 1. FIG. 4 is a cross-sectional view of the AC adapter body 11 taken along line B-B of FIG. 1. In FIGS. 3 and 4, like components are denoted by like reference numerals and are not further described. For the sake of convenience, FIG. 4 illustrates the cross sections of the first circuit board 21, the second circuit board 24, and the first metal wiring 27.

With reference to FIGS. 1, 3, and 4, the second circuit board 24 is for mounting the connector 25 thereon. The second circuit board 24 includes a substrate body 41 and wiring patterns (second wiring patterns) 43, 44. The substrate body 41 includes a first substrate surface (connector mounting surface) 41A, a second substrate surface 41B positioned on the side opposite of the first substrate surface 41A, and a notch part 42. The first substrate surface 41A is for mounting the connector 25 thereon. The second substrate surface 41B is for having the wiring patterns 43, 44 formed thereon. The notch part 42 is formed in the substrate body 41 at a position facing the notch part 34 formed in the substrate body 31. For example, a resin substrate may be used as the substrate body 41.

The wiring patterns 43, 44 are formed on the second substrate surface 41B of the substrate body 41. The wiring pattern 43 electrically connects the connector 25 and the first metal wiring 27. The wiring pattern 44 electrically connects the connector 25 and the second metal wiring 28.

The second circuit board 24 includes a third through-hole 130 (see FIG. 4) penetrating through the substrate body 41 and the wiring pattern 43 and a fourth through-hole 140 (see FIG. 5) penetrating through the substrate body 41 and the wiring pattern 44. The third through-hole 130 is a hole formed in the substrate body 41 and the wiring pattern 43 into which the first metal wiring 27 is inserted. The fourth through-hole 140 is a hole of the substrate body 41 and the wiring pattern 44 into which the second metal wiring 28 is inserted.

The second circuit board 24 has a size (size with respect to the in-plane direction) which is smaller than that of the first circuit board 21.

The connector 25 includes a connector body 51 and pin connectors 53, 54. The connector body 51 is mounted on the first surface 41A of the substrate body 41. The connector body 51 is a part to which an AC cord (not illustrated) is inserted. The pin connectors 53, 54, which are provided at a bottom end of the connector body 51, are electrically connected to the connector body 51.

The pin connector 53 penetrates through the substrate body 41 and the wiring pattern 43. The pin connector 53 is fixed to the wiring pattern 43 by solder 56. Thereby, the connector 25 is electrically connected to the wiring pattern 43.

The pin connector 54 penetrates through the substrate body 41 and the wiring pattern 44. The pin connector 54 is fixed to the wiring pattern 44 by the solder 56. Thereby, the connector 25 is electrically connected to the wiring pattern 44.

The first metal wiring 27 includes a curved portion (non-penetration portion) 61*a*, first and second penetration portions 62*a*, 63*a*, and first and second bent portions 65*a*, 66*a*. The curved portion 61*a*, which has a curved shape, is positioned above the first substrate surface 31A of the substrate body 31. The curved portion 61*a* is a portion of the first metal wiring 27 that is not inserted into the first and second circuit boards 21, 24.

The first penetration portion 62*a* is disposed inside the first through-hole 110 penetrating a portion of the substrate body 31 and the wiring pattern 32 located towards a first side of the notch part 34. A part of the first penetration portion 62*a* projecting from the wiring pattern 32 is bent outward. Such outward bent part of the first penetration portion 62*a* is fixed to the wiring pattern 32 by solder (first conductive paste) 58. Thereby, the first penetration portion 62*a* is electrically connected to the wiring pattern 32.

The second penetration portion 63*a* is disposed inside the third through-hole 130 penetrating a portion of the substrate body 41 and the wiring pattern 43 located towards the first side of the notch part 34. A part of the second penetration portion 63*a* projecting from the wiring pattern 43 is bent outward. Such outward bent part of the second penetration portion 63*a* is fixed to the wiring pattern 43 by solder (second conductive paste) 45. Thereby, the second penetration portion 63*a* is electrically connected to the wiring pattern 43.

The first metal wiring 27 can be prevented from detaching from the first and second circuit boards 21, 24 because the first penetration portion 62*a* is fixed to the wiring pattern 32 by outwardly bending the projecting part of the first penetration portion 62*a* and soldering the outwardly bent projecting part of the first penetration portion 62*a* to the wiring pattern 32 with the solder 58 and the second penetration portion 63*a* is fixed to the wiring pattern 43 by outwardly bending the projecting part of the second penetration portion 63*a* and soldering the outwardly bent projecting part of the second penetration portion 63*a* to the wiring pattern 43 with the solder 45.

The first bent portion 65*a* is provided between the first penetration portion 62*a* and the curved portion 61*a*. A first end part of the first bent portion 65*a* is connected to a first end part of the curved portion 61*a*, and a second end part of the first bent portion 65*a* is connected to the first penetration portion 62*a*. The first bent portion 65*a* is integrally formed with the first penetration portion 62*a* and the curved portion 61*a*. The shape of the first bent portion 65*a* may be formed into, for example, a V-shape (facing sideways).

The second bent portion 66*a* is provided between the second penetration portion 63*a* and the curved portion 61*a*. A first end portion of the second bent portion 66*a* is connected to a second end part of the curved portion 61*a*, and a second end part of the second bent portion 66*a* is connected to the second penetration portion 63*a*. The second bent portion 66*a* is integrally formed with the second penetration portion 63*a* and the curved portion 61*a*. The shape of the second bent portion 66*a* may be formed into, for example, a V-shape (facing sideways).

Accordingly, the first metal wiring 27, which is inserted into the first and second circuit boards 21, 24, can be formed with a desired length by providing the first bent portion 65*a* between the first penetration portion 62*a* and the curved portion 61*a* and providing the second bent portion 66*a* between the second penetration portion 63*a* and the curved portion 61*a*.

The material of the first metal wiring 27 may be, for example, an inexpensive plated copper wire (e.g., plated copper wire having a diameter of 0.5 mm). In this case, the first metal wiring 27 can be formed by bending the plated copper wire.

Figure 5:
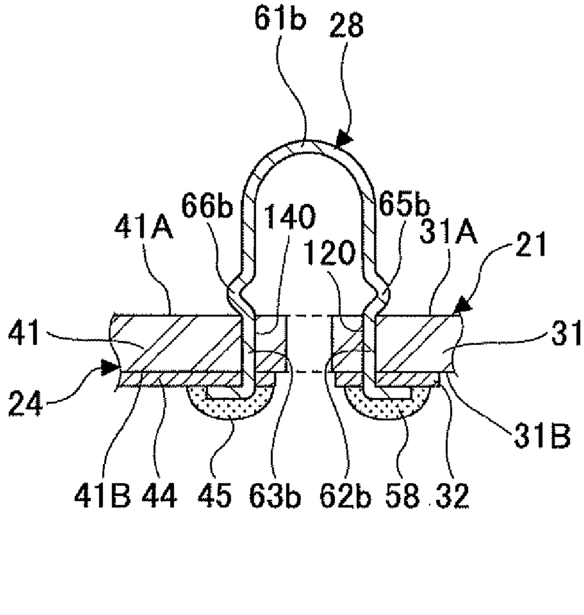
FIG. 5 is a cross-sectional view illustrating a portion of the adapter body 11 of FIG. 1 taken along line C-C of FIG. 1.

FIG. 5 is a cross-sectional view illustrating a portion of the adapter body 11 taken along line C-C of FIG. 1. In FIG. 5, like components are denoted with like reference numerals as those of FIG. 1.

In FIG. 5, the second metal wiring 28 has substantially the same configuration as the first metal wiring 27. That is, the second metal wiring 28 includes a curved portion (non-penetration portion) 61*b*, first and second penetration portions 62*b*, 63*b*, and first and second bent portions 65*b*, 66*b*.

The first penetration portion 62*b* is disposed inside the second through-hole 120 penetrating a portion of the substrate body 31 and the wiring pattern 32 located towards a second side of the notch part 34.

A part of the first penetration portion 62*b* projecting from the wiring pattern 32 is bent outward. Such outward bent part of the first penetration portion 62*b* is fixed to the wiring pattern 32 by the solder 58. Thereby, the second metal wiring 28 is electrically connected to the wiring pattern 32.

The second penetration portion 63*b* is disposed inside the fourth through-hole 140 penetrating a portion of the substrate body 41 and the wiring pattern 44 located towards the second side of the notch part 42. A part of the second penetration portion 63*b* projecting from the wiring pattern 44 is bent outward. Such outward bent part of the second penetration portion 63*b* is fixed to the wiring pattern 44 by solder (second conductive paste) 45. Thereby, the second metal wiring 28 is electrically connected to the wiring pattern 44.

Similar to the first metal wiring 27, the second metal wiring 28, which is inserted into the first and second circuit boards 21, 24, can be formed with a desired length by providing the first bent portion 65*b* between the first penetration portion 62*b* and the curved portion 61*b* and providing the second bent portion 66*b* between the second penetration portion 63*b* and the curved portion 61*a*.

The material of the second metal wiring 28 may be, for example, an inexpensive plated copper wire (e.g., plated copper wire having a diameter of 0.5 mm). In this case, the first metal wiring 28 can be formed by bending the plated copper wire.

The first circuit board 21 having the electronic device 22 mounted thereon and the second circuit board 22 having the connector 25 connected thereto can be electrically connected with each other by using the first and second metal wirings 27, 28 formed of inexpensive plated copper wire. Accordingly, the AC adapter 10 according to the above-described embodiment can be manufactured at a lower cost compared to the AC adapter 200 using an electric wire coated with an insulating material.

Further, unlike the AC adapter 200 of the related art example, there is no need to remove (peel) the insulating material from the electric wire for exposing conductor parts at both ends of the electric wire by using plated copper wire as the material of the first and second metal wirings 27, 28. Therefore, manufacturing cost of the AC adapter 10 can be reduced.

The AC adapter body 11 according to an embodiment of the present invention is manufactured as follows. First, a single base circuit board which is to be a base material of the first and second circuit boards 21, 22 is prepared. Then, the electronic device 22 and the connector 25 are attached (mounted) to the base circuit board. Then, the first and second circuit boards 21, 24 are obtained by cutting the base circuit board. Then, the operation of the first and second circuit boards 21, 24 is tested. Then, the AC adapter body 11 can be obtained by connecting the first and second metal wirings 27, 28 to the first and second circuit boards 21, 24. More specifically, for example, the connecting of the first and second metal wirings 27, 28 to the first and second circuit boards 21, 24 are described as follows. First, the first and second penetration portions 62*a*, 62*b*, 63*a*, 63*b* are inserted into the first-fourth through-holes 110, 120, 130, 140 formed in the first and second circuit boards 21, 24. Then, the first and second penetration portions 62*a*, 62*b*, 63*a*, 63*b* are bent. Then, the bent portions of the first and second penetration portions 62*a*, 62*b*, 63*a*, 63*b* are fixed to wirings 43, 44 by the solder 45, 58.

With reference to FIG. 1, the DC cord 12, which has a first end portion attached to the first circuit board 21, is electrically connected to the wiring pattern 32 of the first circuit board 21. A plug 71 is provided on a second end portion of the DC cord 12. The plug 71 is for connecting to an electronic device (not illustrated) such as a mobile electronic device. The DC cord 12 is attached to the first circuit board after the manufacturing of the AC adapter body 11 is completed.

With reference to FIG. 1, a lower case 13, which is formed of a material having an insulating property, includes a plate part 74, a frame part 75, a first projecting part 77, and a second projecting part 78. The lower case 13 is a portion of the AC adapter 10 that faces the second substrate surfaces 31B, 41B of the substrate bodies 31, 41 (see FIG. 4) when the AC adapter body 11 is installed in the lower case 13.

The frame part 75 is provided in a manner surrounding (encompassing) the plate part 74. The frame part 75 includes first and second opening parts 81, 82. The first opening part 81 is formed at a portion of the frame part 75 that faces the connector 25. The second opening part 82 is formed at a portion of the frame part 75 that faces the DC cord 12.

Figure 6:
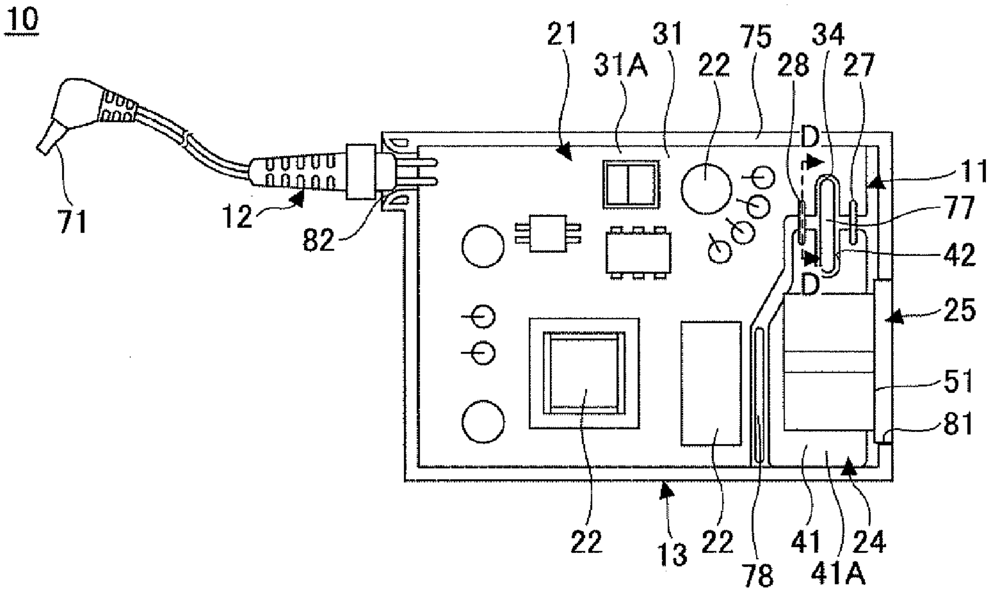
FIG. 6 is a plan view illustrating an AC adapter body installed in a lower case according to an embodiment of the present invention.

FIG. 6 is a plan view illustrating the AC adapter body 11 installed in the lower case 13 according to an embodiment of the present invention. In FIG. 6, like components are denoted with like reference numerals as those of FIG. 1.

Figure 10:
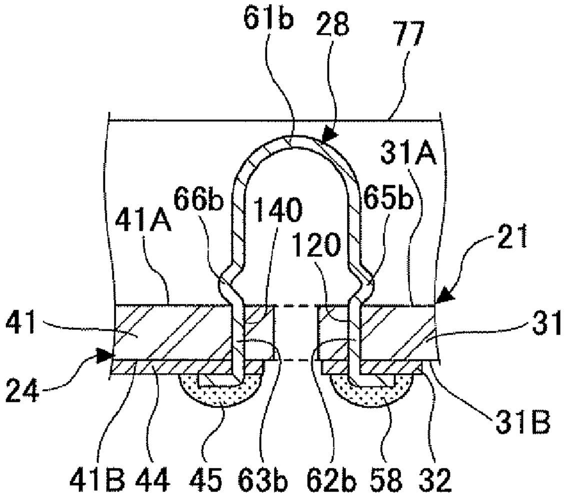
FIG. 10 is a cross-sectional view illustrating a portion of the adapter body 11 of FIG. 6 taken along line D-D of FIG. 6.

With reference to FIGS. 1 and 6, the first projecting part 77 is provided on a portion of the plate part 74 facing the notch parts 34, 42 of the first and second circuit boards 21, 24. The first projecting part 77 is integrally formed with the plate part 74. The first projecting part 77 penetrates through the notch parts 34, 42 when the AC adapter body 11 is installed in the lower case 13. In the state where the AC adapter body 11 is installed in lower case 13, the first projecting part 77 has a height substantially equal to or greater than the height of the first and second metal wirings 27, 28 relative to the first and second substrate surfaces 31A, 41A (see FIG. 10). Accordingly, the first projecting part 77 serves as a partition plate positioned between the first metal wiring 27 and the second metal, wiring 28. Therefore, the first metal wiring 27 and the second metal wiring 28 are insulated by the first projecting part 77 interposed therebetween.

By providing the first projecting part 77 having an insulating property at a portion of the lower case 13 between the first and second metal wirings 27, 28, contact between the first and second metal wirings 27, 28 can be prevented. In other words, an inexpensive plated copper wire which is not coated by an insulating material can be used as the first and second metal wirings that electrically connect the first and second circuit boards 21, 24 by providing the first projecting part 77 having an insulating property between the first and second metal wirings 27, 28.

Further, a step for forming the first projecting part 77 is not necessary because the plate part 74 and the first projecting part 77 are integrally formed. Therefore, manufacturing cost of the AC adapter 10 can be prevented from increasing.

The second projecting part 78 is provided on a portion of the plate part 74 corresponding to a space between the first and second circuit boards 21, 24. The second projecting part 78 is integrally formed with the plate part 74. The second projecting part 78 serves as a partition plate for defining (restricting) the positions of the first and second circuit boards 21, 24 inside the lower case 13.

The upper case 14, which is formed of a material having an insulating property, includes a plate part 85, a frame part 86, a first opening part 88, and a second opening part 89. The plate part 85, which has a planar shape, is a portion of the upper case 14 facing the first substrate surface (device mounting surface) 31A of the substrate body 31 and the first substrate surface (connector mounting surface) 41A of the substrate body 41 when the AC adapter body 11 is installed in the upper case 14.

The frame part 86 is provided in a manner surrounding (encompassing) the plate part 85. The first opening part 88 is formed at a portion of the frame part 86 facing the connector 25. The second opening part 89 is formed at a portion of the frame part 86 facing the DC cord 12.

The upper case 14 is configured to attach with the lower case 13 on which the AC adapter body 11 is mounted.

With the above-described embodiment of the AC adapter 10, contact between the first and second metal wirings 27, 28 can be prevented by providing the insulating first projecting part 77 on a portion of the lower case 13 between the first and second metal wirings 27, 28. Accordingly, an inexpensive plated copper wire which is not covered with an insulating material can be used as the first and second metal wirings 27, 28 for electrically connecting the first and second circuit boards 21, 24. That is, there is no need to cover the first and second metal wirings 27, 28 with an insulating material. Thus, manufacturing costs of the AC adapter 10 can be reduced.

Further, because the plate part 74 and the first projecting part 77 are integrally formed, there is no need for a separate step for forming the first projecting part 77. Accordingly, manufacturing cost of the AC adapter 10 can be prevented from increasing.

[Second Embodiment]

Figure 7:
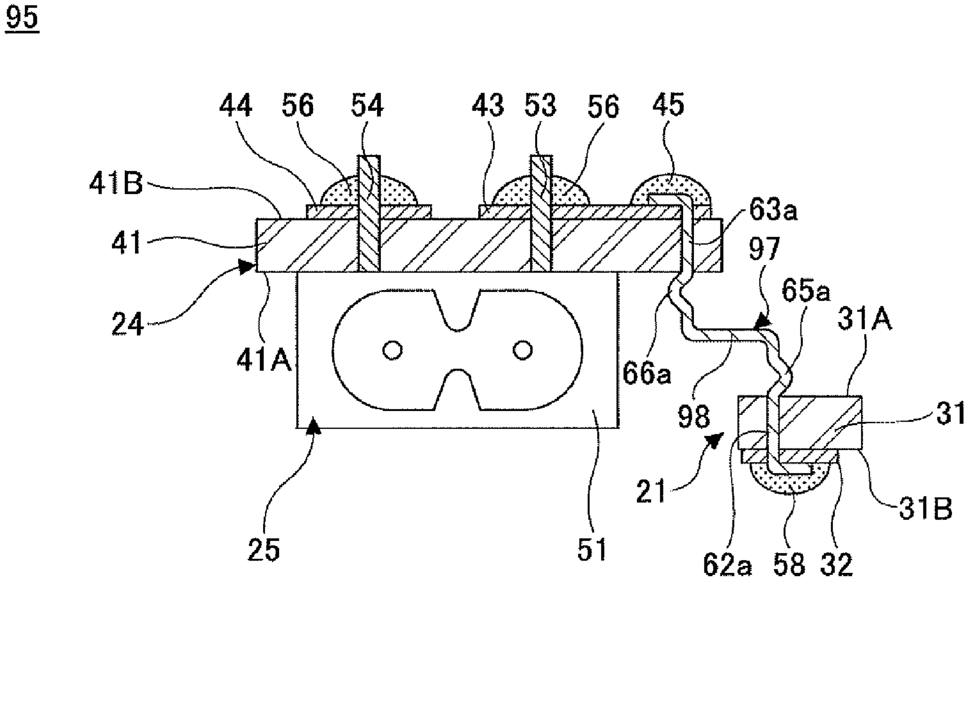
FIG. 7 is a cross-sectional view illustrating an AC adapter body according to a second embodiment of the present invention.
Figure 8:
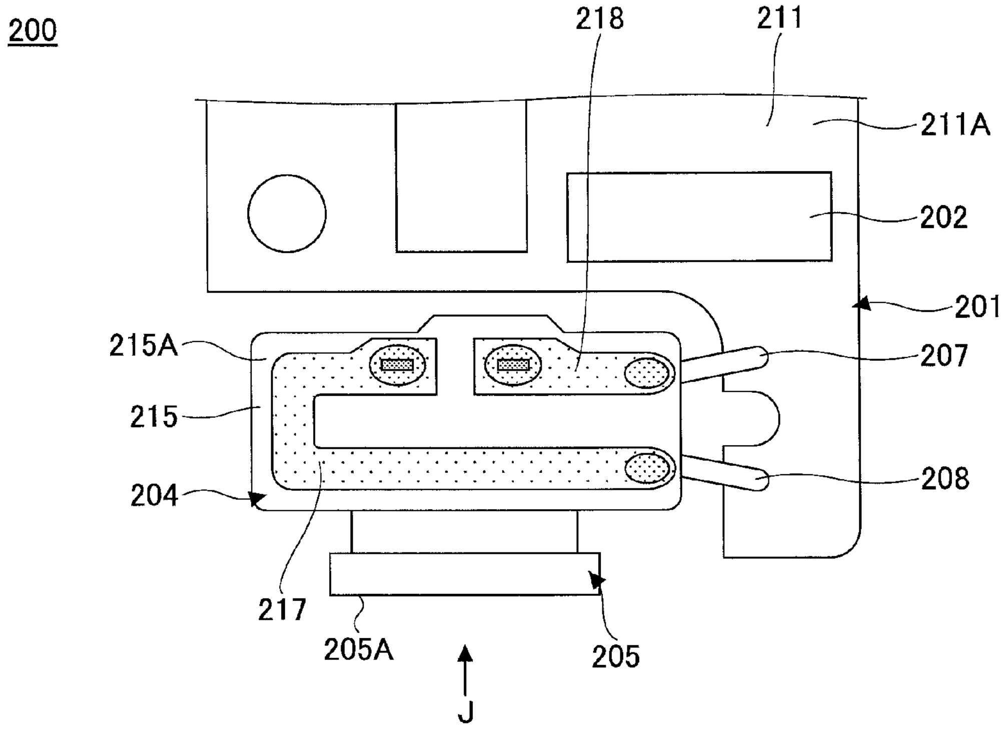
FIG.8 RELATED ART
FIG. 8 is a plan enlarged view of a connection part that connects first and second circuit boards of an AC adapter according to a related art example.
Figure 9:
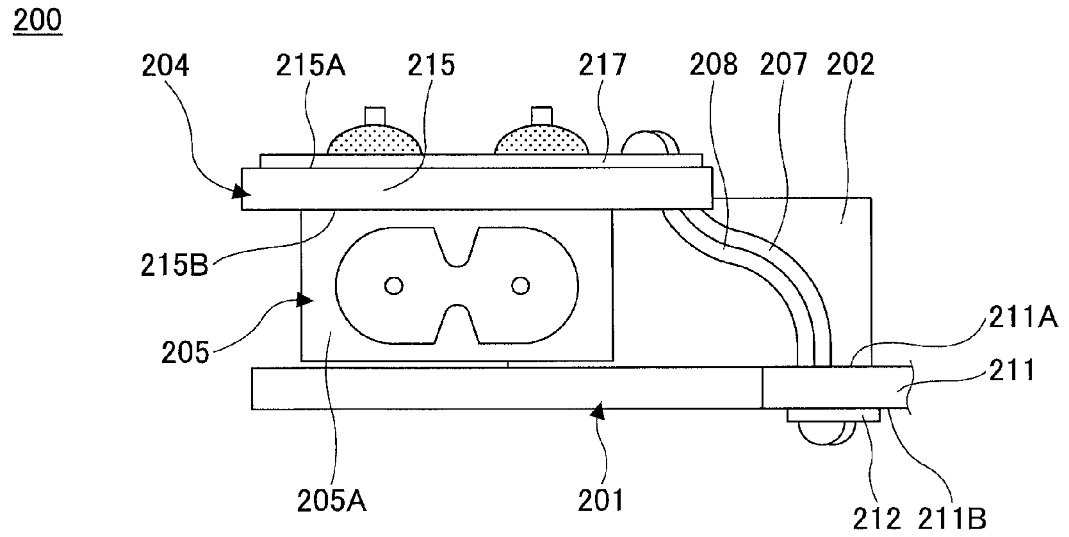
FIG.9 RELATED ART
FIG. 9 is a schematic diagram of the configuration illustrated in FIG. 8 in a case where a configuration is viewed from letter J of FIG. 8.

FIG. 7 is a cross-sectional view illustrating an AC adapter body 95 according to a second embodiment of the present invention. FIG. 7 illustrates the AC adapter body 95 dissected at substantially the same region as that of the AC adapter body 11 illustrated in FIG. 4. In FIG. 7, like components of the AC adapter body 95 are denoted with like reference numerals as those of the AC adapter body 11 of FIG. 4.

In the above-described first embodiment of the AC adapter body 11, the first and second metal wirings 27, 28 are used for electrically connecting the first and second circuit boards 21, 24 that are positioned substantially on the same plane relative to the height direction of the AC adapter 10. Therefore, for example, the first and second circuit boards 21, 24 may be positioned substantially flush with each other. In the AC adapter body 95 according to the second embodiment, two metal wirings 97 are used for electrically connecting the first and second circuit boards 21, 24 that are positioned on different planes relative to the height direction of the AC adapter 10. It is to be noted that FIG. 7 shows only one of the metal wirings 97 for convenience in illustrating the AC adapter body 95.

Other than using two metal wirings 97 for connecting the first and second circuit boards 21, 24 positioned on different planes relative to the height direction, the AC adapter body 95 has substantially the same configuration as the AC adapter body 11.

Instead of the curved portions 61*a*, 61*b* of the first and second metal wirings 27, 28, each of the metal wirings 97 has a support portion 98 having a key-like shape. Other than having the support portion 98, the metal wirings 97 have substantially the same configurations as the first and second metal wirings 27, 28.

In the AC adapter body 95 according to the second embodiment, the first surface (connector mounting surface) 41A of the substrate body 41 is positioned facing a plane extending from the first substrate surface (device mounting surface) 31A of the substrate body 31.

The AC adapter 10 including the AC adapter body 95 can attain the same advantages (effects) as the above-described AC adapter 10 including the AC adapter body 11.

Further, the present invention is not limited to these embodiments, but variations and modifications may be made without departing from the scope of the present invention.

For example, the shapes of the curved portions 61*a*, 61*b* of the first and second metal wirings and the bent portions 65*a*, 65*b*, 66*a*, 66*b* are not limited to those of the above-described embodiments of the present invention.

Further, the shape of the support parts 98 of the two metal wirings 97 is not limited to the key-like shape illustrated in FIG. 7.

The present application is based on Japanese Priority Application No. 2010-031903 filed on Feb. 17, 2010, with the Japanese Patent Office, the entire contents of which are hereby incorporated by reference.

What is claimed is:

1. An AC adapter comprising:

an electronic device;

a first circuit board on which the electronic device is mounted;

a second circuit board separated from the first circuit board;

a connector mounted on the second circuit board and electrically connected to the second circuit board;

first and second metal wirings that electrically connect the first and the second circuit boards; and an insulation case installing the first circuit hoard, the electronic device, the second circuit board, and the connector therein and including a projecting part interposed between the first and second metal wirings.

2. The AC adapter as claimed in claim 1, wherein the first circuit board includes a first wiring pattern electrically connected to the electronic device;

wherein the second circuit board includes a second wiring pattern electrically connected to the connector;

wherein the first and second metal wirings each include a first end part soldered to the first wiring pattern by a first conductive paste; and wherein the first and second metal wirings each include a second end part soldered to the second wiring pattern by a second conductive paste.

3. The AC adapter as claimed in claim. 1, wherein the first circuit board includes first and second through-holes;

wherein the second circuit board includes third and fourth through-holes;

wherein the first metal wiring includes a first non-penetration portion, a first penetration portion penetrating through the first circuit board, a first bent portion provided between the first non-penetration portion and the first penetration portion, a second penetration portion penetrating through the second circuit board, and a second bent portion provided between the first non-penetration portion and the second penetration portion;

wherein the second metal wiring includes a second non-penetration portion, a third penetration portion penetrating through the second circuit board, a third bent portion provided between the second non-penetration portion and the third penetration portion, a fourth penetration portion penetrating through the second circuit board, and a fourth bent portion provided between the second non-penetration portion and the fourth penetration portion.

4. The AC adapter as claimed in claim 1, wherein the first and second metal wirings are plated copper wires.

5. The AC adapter as claimed in claim 1, wherein the projecting part is integrally formed with the insulation case.

6. The AC adapter as claimed in claim 1, wherein the first circuit board and the second circuit board are positioned on a same plane relative to a height direction of the AC adapter.

7. The AC adapter as claimed in claim 1, wherein the first circuit board and the second circuit board are positioned on different planes relative to a height direction of the AC adapter.

* * * * *